United States Patent
Robinson et al.

(10) Patent No.: US 7,321,132 B2
(45) Date of Patent: Jan. 22, 2008

(54) MULTI-LAYER STRUCTURE FOR USE IN THE FABRICATION OF INTEGRATED CIRCUIT DEVICES AND METHODS FOR FABRICATION OF SAME

(75) Inventors: Kevin L. Robinson, Clay, NY (US); Larry Witkowski, Plano, TX (US); Ming-Yih Kao, Dallas, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 135 days.

(21) Appl. No.: 11/080,293

(22) Filed: Mar. 15, 2005

(65) Prior Publication Data

US 2006/0208279 A1  Sep. 21, 2006

(51) Int. Cl.
*H01L 29/06* (2006.01)
*H01L 29/201* (2006.01)
*H01L 29/732* (2006.01)
*H01L 21/338* (2006.01)

(52) U.S. Cl. ............... 257/12; 257/90; 257/94; 257/183; 438/167; 438/172; 438/186; 438/191

(58) Field of Classification Search ............... 438/167, 438/172, 186, 191; 257/12, 90, 94, 183, 257/280
See application file for complete search history.

(56) References Cited

U.S. PATENT DOCUMENTS

| | | |
|---|---|---|
| 5,030,852 A | 7/1991 | Higashisaka |
| 5,270,228 A | 12/1993 | Ishikawa |
| 5,339,083 A | 8/1994 | Inami |
| 5,364,816 A | 11/1994 | Boos et al. |
| 5,705,940 A | 1/1998 | Newman et al. |
| 6,242,293 B1 | 6/2001 | Danzilio |
| 6,248,666 B1 | 6/2001 | Frijlink et al. |
| 6,271,547 B1 | 8/2001 | Hoke et al. |
| 6,307,221 B1 | 10/2001 | Danzilio |
| 6,542,037 B2 | 4/2003 | Noll et al. |
| 6,573,129 B2 | 6/2003 | Hoke et al. |
| 6,593,603 B1 | 7/2003 | Kim et al. |
| 6,620,662 B2 | 9/2003 | Hoke et al. |
| 6,703,638 B2 * | 3/2004 | Danzilio ............... 257/12 |
| 6,797,994 B1 | 9/2004 | Hoke et al. |
| 6,870,207 B2 | 3/2005 | Taylor |
| 2002/0171076 A1 | 11/2002 | Danzilio |
| 2002/0177261 A1 | 11/2002 | Song |
| 2006/0208279 A1 | 9/2006 | Robinson et al. |

* cited by examiner

*Primary Examiner*—Hsien-Ming Lee
(74) *Attorney, Agent, or Firm*—Howard IP Law Group

(57) ABSTRACT

A multi-layer structure for use in the fabrication of integrated circuit devices is adapted for the formation of enhancement mode high electron mobility transistors, depletion mode high electron mobility transistors, and power high electron mobility transistors. The structure has, on a substrate, a channel layer, spacer layer on the channel layer, a first Schottky layer, a second Schottky layer on the first Schottky layer, and a third Schottky layer on the second Schottky layer, and a contact layer on the third Schottky layer. Etch stops are defined intermediate the first and second Schottky layers, intermediate the second and third Schottky layers, and intermediate the third Schottky layer and the contact layer.

14 Claims, 10 Drawing Sheets

MULTI-LAYER STRUCTURE FOR USE IN THE FABRICATION OF INTEGRATED CIRCUIT DEVICES AND METHODS FOR FABRICATION OF SAME

FIELD OF INVENTION

The present invention relates to integrated circuit devices, and more particularly to active layers for use in the fabrication of integrated circuit devices, particularly high electron mobility transistors.

BACKGROUND

Several types of field effect transistors (FETs) are available for use at microwave and millimeter wave frequencies in the fabrication of monolithic microwave integrated circuits (MMIC). FETs that operate at these frequencies are generally referred to as high-frequency FETs. These high frequency FETs include metal semiconductor field effect transistors (MESFETs) and high electron mobility transistors (HEMTs). Typically, HEMTs are formed from Group III-V materials such as gallium arsenide (GaAs) or indium phosphide (InP), although other materials may be used. In a HEMT there is a doped donor/undoped spacer layer of one material and an undoped channel layer of a different material. A heterojunction is formed between the doped donor/undoped spacer layer and the undoped channel layer. The doped donor layer has a wider bandgap than the undoped channel layer. Due to the conduction band discontinuity at the heterojunction, electrons are injected from the doped donor/undoped spacer layer into the undoped channel layer. Thus, electrons from the relatively large bandgap donor layer are transferred into the relatively narrow bandgap channel layer where they are confined to move only in a plane parallel to the heterojunction. Consequently, there is spatial separation between the donor atoms in the donor layer and the electrons in the channel layer resulting in low impurity scattering and good electron mobility. A layer characterized by movement of electrons confined to a plane parallel to a junction and good electron mobility is referred to as a two-dimensional electron gas.

There are generally three types of HEMTs. One type is referred to simply as a HEMT, whereas the other types are referred to as pseudomorphic HEMTs or PHEMTs and metamorphic HEMTs or MHEMTs. The differences among the HEMT, PHEMT, and MHEMT are that, in the PHEMT, one or more of the layers incorporated into the device has a lattice constant which differs slightly from the lattice constants of other materials of the device, in the MHEMT, one or more of the layers incorporated into the device has a lattice constant which differs significantly from the lattice constants of other materials of the device. As a result of this lattice mismatch, the crystal structure of the material forming the channel layer is strained. Although this lattice mismatch and the attendant strain makes growth of such devices more difficult than the growth of HEMTs, several performance advantages are obtained. For example, the charge density transferred into the channel layer is increased and high electron mobility and high electron saturated velocity are observed. As a result, the devices can develop higher power levels and can operate at higher frequencies with improved noise properties.

An enhancement-mode transistor is a transistor that blocks the flow of current when no gate-source voltage is applied (also called a normally-off transistor). A depletion-mode transistor is a transistor that allows current to flow when no gate-source voltage is applied (also called a normally-on transistor). Typically, the thickness of the active region upon which the gate contact is formed is different for each of these transistors, with this thickness being smaller for the enhancement-type transistor than it is for the depletion-type transistor. The voltage threshold between the two states of these transitions is known as the pinch-off voltage. The pinch-off voltage of a given device is dependent on the thickness of the active region on which the gate contact is formed.

A power HEMT is a depletion mode HEMT characterized by higher drain operating voltage than a conventional depletion mode HEMT. A power HEMT has, as a result of the higher drain operating voltage, a higher output power density. However, a power HEMT or pHEMT, unlike a conventional depletion mode HEMT or PHEMT, typically requires a double gate recess, having two aligned recesses of different widths. Unless otherwise stated, a reference to a depletion mode transistor in this application does not include power mode HEMTs.

In the fabrication of MMICs, it is desirable to employ depletion mode pHEMTs, enhancement mode pHEMTs, and power pHEMTs. It has been understood in the prior art that differing active layers are required for formation of these three types of pHEMTs. In particular, the active layers must have different configurations of etch stops in order to enable formation of different types of pHEMTs. An active layer suitable for formation of both enhancement mode HEMTs and depletion mode HEMTs was disclosed in U.S. Patent Publication No. 2002/0177261 (Song). However, in devices employing power pHEMTs and either or both of depletion mode and enhancement mode pHEMTs, a second active layer is required.

Referring to FIG. 1, a multi-layer structure of the prior art suitable for formation of an enhancement mode pHEMT is shown in cross section. The prior art structure has substrate 10, which is typically of GaAs. Buffer layer 12 is formed on substrate 10. Buffer layer 12 is typically of GaAs, and may include a superlattice of alternating layers of GaAs and AlAs. A thin Si doping layer 14 is provided by silicon pulse doping on buffer layer 12. Spacer layer 16 is provided on doping layer 14. Channel layer 18 on spacer layer 16 may be of InGaAs, or other Type III-V semiconductor material with a relatively narrow bandgap. A second spacer layer 20 is provided on channel layer 18. Spacer layers 16, 20 are of a material such as AlGaAs, which has a relatively wide band gap compared to that of the material of channel layer 16. Second thin Si doping layer 22 is provided on spacer layer 20. Doped semiconductor layer, or Schottky layer, 24, which may be of the same material as spacer layer 18, but with n minus doping, is on second thin Si doping layer 22. A two-dimensional electron gas layer may be obtained in channel layer 16. Contact layer 24, which may be of GaAs, is formed on doped semiconductor layer 22. Contact layer 24 is adapted for formation of drain and source electrodes (not shown). Suitable recesses are formed by etching into contact layer 24, and gates are metallized in the recesses. Depending on the depth of the recess, either depletion mode or enhancement mode HEMTs may be fabricated.

SUMMARY OF THE INVENTION

In one embodiment of the invention, a multilayer structure for fabrication of integrated circuit devices includes: a buffer layer on a substrate; a channel layer on the buffer layer; a spacer layer on the channel layer; a first Schottky layer on the spacer layer; a second Schottky layer overlying the first Schottky layer; a third Schottky layer overlying the second Schottky layer; and a contact layer overlying said third Schottky layer. The structure has defined therein a first etch-stop intermediate the first Schottky layer and the second Schottky layer; a second etch-stop intermediate the second Schottky layer and the third Schottky layer; and a third etch-stop intermediate the contact layer and the third Schottky layer.

In another embodiment of the invention, a method of fabricating a multi-layer structure for use in the fabrication of integrated circuit devices includes forming a buffer layer on a substrate; forming a channel layer on the buffer layer; forming a spacer layer on the channel layer; forming a first Schottky layer on the spacer layer; forming a second Schottky layer on the first Schottky layer; forming a third Schottky layer on the second Schottky layer; and forming a contact layer on the third Schottky layer. The method also includes defining a first etch stop intermediate the first Schottky layer and the second Schottky layer; a second etch stop intermediate the second Schottky layer and the third Schottky layer, and a third etch-stop intermediate the third Schottky layer and the contact layer.

In another embodiment of the invention, method of fabricating high electron mobility transistors on a unitary structure having a contact layer, includes etching a contact layer of the structure to a third etch stop to define a first recess portion of a power HEMT gate recess having a first power HEMT gate recess portion width; (b) etching the contact layer of the structure to the third etch stop to define a partial depletion mode HEMT gate recess having a depletion mode gate width less than the first power HEMT gate recess portion width; (c) etching the structure in the power HEMT gate recess through the third etch stop to a second etch stop to define a second recess portion of the power HEMT gate recess, having a second recess portion width less than the first recess portion width; (d) etching in the depletion mode HEMT gate recess through the third etch stop to the second etch stop to define a depletion mode HEMT gate recess; (e) forming a gate electrode in the power HEMT gate recess; and (f) forming a gate electrode in the depletion mode HEMT gate recess.

In another embodiment of the invention, an integrated circuit includes a multilayered structure formed on a substrate, and operatively connected elements formed on the substrate. The multilayered structure has a buffer layer on the substrate; a channel layer on the buffer layer; a spacer layer on the channel layer; a first Schottky layer on the spacer layer; a second Schottky layer overlying the first Schottky layer; a third Schottky layer overlying the second Schottky layer; and a contact layer overlying the third Schottky layer. The structure has defined therein a first etch-stop intermediate the first Schottky layer and the second Schottky layer; a second etch-stop intermediate the second Schottky layer and the third Schottky layer; and a third etch-stop intermediate the contact layer and the third Schottky layer. The operatively connected elements include at least one enhancement mode HEMT, the enhancement mode HEMT comprising a first gate electrode formed in a first recess in the multilayered structure, the first recess and the first gate electrode extending to and terminating at the first etch stop; at least one depletion mode HEMT comprising a second gate electrode formed in a second recess in the multilayered structure, the second recess and the second gate electrode extending to and terminating at the second etch stop; and at least one power HEMT comprising a third gate electrode formed in a third recess in the multilayered structure, the third recess having a first recess portion with a first recess portion width extending to and terminating at the first etch-stop and a second recess portion having a second recess portion width less than the first portion width, the second recess portion and the third gate electrode extending to and terminating at the second etch stop.

DETAILED DESCRIPTION

Figure 1:
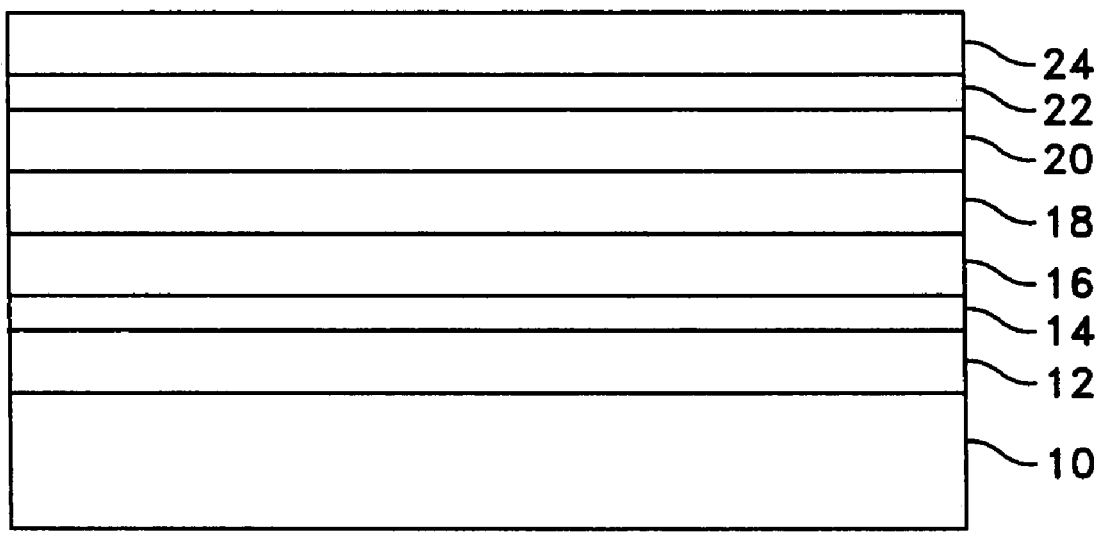
FIG. 1 is a partial sectional view showing a multi-layer structure of the prior art.
Figure 2:
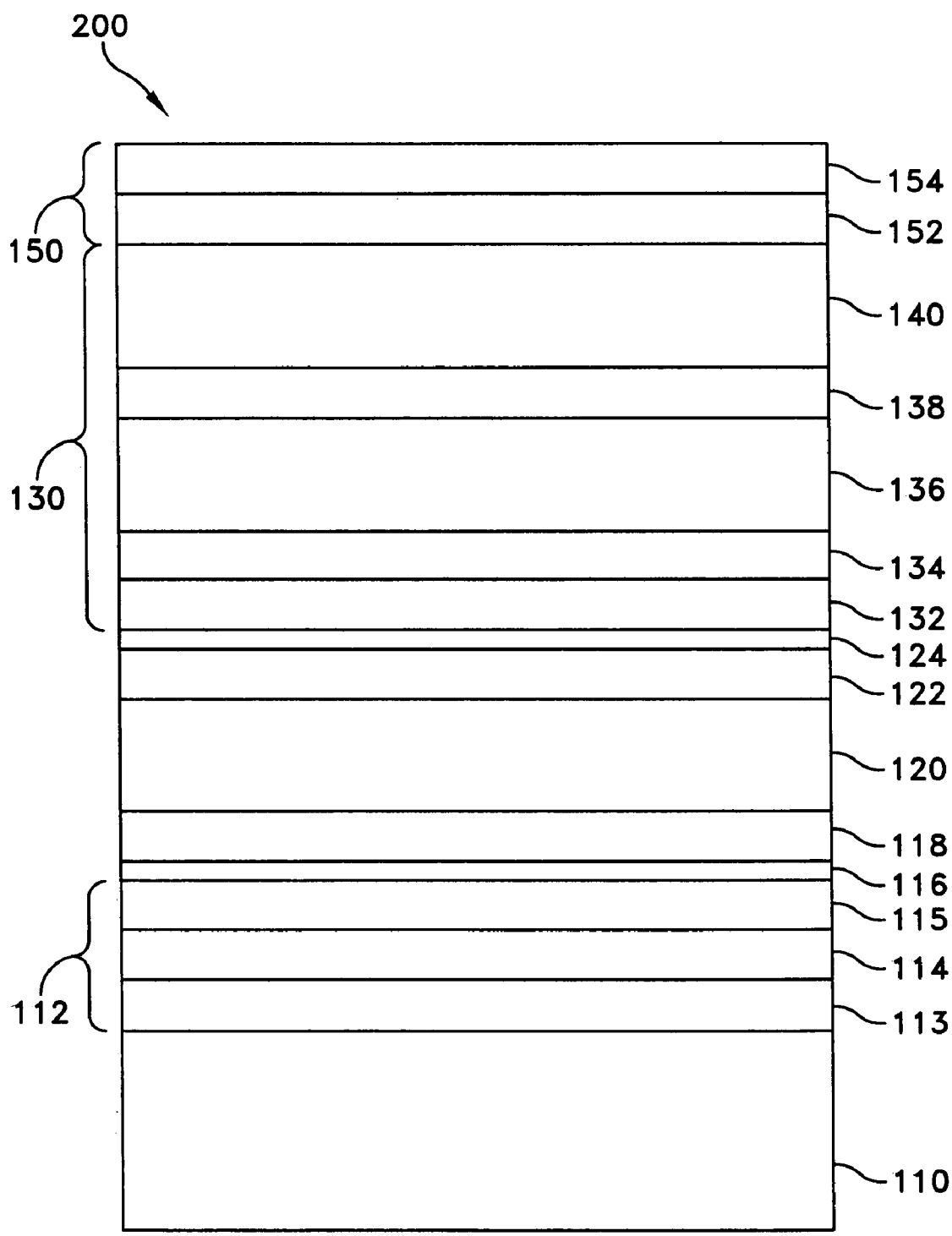
FIG. 2 is a partial sectional view showing a multi-layer structure of the invention.

Referring to FIG. 2 a multi-layer structure according to an embodiment of the invention will now be described. Structure 200 is a multi-layer structure adapted for formation of three different types of devices, and in particular three different types of HEMTs, and in particular three different types of pHEMTs, which types are characterized by at least two different pinch-off voltages.

The multi-layer structure 200 has a substrate 110. Substrate 110 may be of a semi-insulating material, such as GaAs. Buffer layer 112 is formed on substrate 110. Buffer layer 112 may include a superlattice layer 113, an undoped AlAs layer 114 on superlattice layer 113, and an undoped AlGaAs layer 115 on undoped AlAs layer 114. A superlattice is a semiconductor structure having at least four, and typically many more, extremely thin layers of semiconductor material, generally not more than about 100 angstroms each, and in some implementations not more than about 40 angstroms each; adjacent layers in a superlattice are typically selected so that the energy bandgap varies slightly between adjacent layers. Superlattice layer 113 may include alternating layers of GaAs and AlAs. By way of example, the GaAs layers may be undoped, as may the AlAs layers. The layer thickness may be about 30 angstroms for the GaAs layers, and about 20 angstroms for the AlAs layers. The number of layers in superlattice layer 113 may be about 40. Undoped AlAs layer 114 may be about 20 angstroms in thickness. AlGaAs layer 115 may be about 40 angstroms in thickness, and the molar ratio of aluminum to gallium may be about 24 to 76.

Those of skill in the art will appreciate that a variety of suitable semi-insulating substrates and buffer layers may be substituted for the example described above.

The channel structure is then formed on buffer layer 112. A channel structure includes the channel layer itself, at least one charge donor layer, and at least one spacer layer intermediate the channel layer and the charge donor layer. In the following example, a charge donor layer and spacer layer are provided both above and below the channel layer.

In this embodiment, a charge donor layer 116 is formed on buffer layer 112. By way of example, charge donor layer 116 may be a layer of silicon atoms. Charge donor layer 116 may be formed by silicon pulse doping. Doping to a concentration of about $1.1 \times 10^{12}$ cm$^{-2}$ ($1.1 \times 10^{12}$ per square centimeter) may be employed.

Spacer layer 118 is preferably formed on buffer layer 112, after formation of charge donor layer 116. Spacer layer 118 may be a Type III-V semiconductor, such as AlGaAs, selected to have a relatively wide bandgap, and may be undoped. Spacer layer 118 may have a thickness of about 40 angstroms, and may have an aluminum molar fraction of about 0.24. Channel layer 120 is then formed on spacer layer 118. Channel layer 120 is formed of a relatively narrow bandgap semiconductor, and may be a Type III-V semiconductor, such as GaAs, to provide a HEMT, or of a material with a lattice mismatch relative to spacer layer 118, such as InGaAs with an indium molar fraction of up to about 25 percent, to provide a pHEMT. Channel layer 120 may have a thickness of between about 50 and about 200 angstroms, which may be selected depending on the desired current and pinch-off voltages. In one example, the thickness of channel layer 120 may be about 130 angstroms, and the indium molar fraction may be about 20 percent.

A second spacer layer 122 is formed on channel layer 120. Second spacer layer 122 of may be of a semiconductor, such as a III-V semiconductor such as AlGaAs, selected to have a relatively wide bandgap and, for a pHEMT, to provide a suitable lattice mismatch with the material of the channel layer 120.

Second spacer layer 122 may be relatively thin, such as about 40 angstroms in thickness.

A charge donor layer 124 is then provided on second spacer layer 122. Any suitable charge donor may be employed. By way of example, charge donor layer 124 may be a layer of silicon atoms. Charge donor layer 124 may be formed by silicon pulse doping. Doping to a concentration of $4.4 \times 10^{12}$ cm$^{-2}$ may be employed.

The characteristics, including materials, dopant selection and concentrations, and dimensions, of channel layer 120, spacer layers 118, 122, and charge donor layers 116, 124, are selected to provide a two-dimensional electron gas in channel layer 120 upon application of a suitable electric field. Those of ordinary skill in the art may vary the materials and dimensions in various manners so long as a two-dimensional electron gas is obtained. For example, in some implementations, only one spacer layer and one charge donor layer may be required.

A structure 130 incorporating at least three Schottky layers and having at least three etch-stops defined therein is then provided on the charge donor layer 124 associated with the channel layer 120. Each Schottky layer is adapted to control the charge flow in underlying channel layer 120. The Schottky layers may all be of the same doped semiconductor, or of differing substances. An etch stop may be a layer of a material with the primary, or only, function of serving as an etch stop layer, or an etch stop may be a transition from a layer susceptible to etching by a selected etchant to a layer that is not effectively susceptible to etching by the selected etchant.

A first layer of the Schottky and etch-stop layer structure 130 is a first Schottky layer 132. First Schottky layer 132 is of a doped semiconducting material. Preferably, first Schottky layer 132 is of a semiconducting material having a relatively wide bandgap. Examples of suitable materials semiconductors include Type III-V semiconductor, such as AlGaAs and GaAs.

In one implementation, first Schottky layer 132 may be of doped AlGaAs. First Schottky layer 132 may be doped to a concentration of $3 \times 10^{17}$ cm$^{-3}$, and may have a molar fraction of aluminum of about 0.24. The thickness may be between about 10 Angstroms to about 1000 Angstroms, depending on the desired current and pinch-off voltages. In one embodiment, the thickness may be about 45 angstroms. First Schottky layer 132 serves as a Schottky layer for an enhancement mode type pHEMT, as explained below.

A first etch stop layer 134 is then provided on first Schottky layer 132. Etch stop layer 134, is chemically distinct from an overlying layer, so that an etch process effective in etching the overlying layer, is substantially ineffective in etching etch stop layer 134. Preferably, an etch process is available that is effective in etching all of the overlying layers, but is substantially ineffective in etching etch stop layer 134. In one embodiment, etch stop layer 134 is of silicon doped GaInP, with a dopant concentration of about $3 \times 10^{17}$ cm$^{-3}$, and gallium and indium molar concentrations of about 50 percent. Etch stop layer 134 may have a thickness of 40 angstroms.

Second Schottky layer 136 is provided overlying first Schottky layer 132, and in particular on first etch stop layer 134. First etch stop layer 134, and thus a first etch stop, is intermediate first Schottky layer 132 and second Schottky layer 136. Second Schottky layer 136 is of a doped semiconducting material and thickness between about 10 Angstroms to about 1000 Angstroms, depending on the desired current and pinch-off voltages. In an exemplary implementation, second Schottky layer is of the same material as first Schottky layer. Second Schottky layer 136 may have the same or different dopant concentration. In an exemplary embodiment, second Schottky layer 136 is of silicon doped AlGaAs. In one embodiment, second Schottky layer 136 may have a dopant concentration of about $3 \times 10^{17}$ cm$^{-3}$, molar aluminum content of about 24 percent, and thickness of about 100 angstroms.

An intermediate or second etch stop is defined overlying second Schottky layer 136. In the disclosed embodiment, the second etch stop is second etch stop layer 138. Second etch stop layer 138 is selected to be of a material that will not be effectively etched by an etch process that effectively etches at least the immediately overlying layer, and preferably all of the overlying layers. In this embodiment, second etch stop layer 138 is selected to be of a material that will not be effectively etched by an etch process that effectively etches at least overlying third Schottky layer 140. Second etch stop layer 138 may also be selected to be of a material is different from the material of first etch stop layer 134, and that will be effectively etched by an etch process that does not effectively etch first etch stop layer 134. By way of example, second etch stop layer 138 may be of silicon doped AlAs, with dopant concentration of about $3 \times 10^{17}$ cm$^{-3}$.

Third Schottky layer 140 is formed overlying second Schottky layer 136 and on second etch stop layer 138. Second etch stop layer, and the second etch stop, are thus intermediate second Schottky layer 136 and third Schottky layer 140. Third Schottky layer 140 is of a doped semiconducting material having a thickness between about 10 Angstroms to about 1000 Angstroms, with the material and thickness depending on the desired current and pinch-off voltages. In an exemplary embodiment, third Schottky layer 140 is of the same material as first Schottky layer 132 and second Schottky layer 136. Third Schottky layer 140 may have the same or different dopant concentration as the other Schottky layers. In an exemplary embodiment, third Schottky layer 140 is of silicon doped AlGaAs. In one embodiment, third Schottky layer 140 may have a dopant concentration of about $3 \times 10^{17}$ $cm^{-3}$, molar aluminum content of 24 percent, and thickness of about 295 angstroms.

A contact layer 150 is formed on third Schottky layer 140. Contact layer 150 is selected to be of a material that is etchable by an etch technique or solution to which third Schottky layer 140 is substantially etch-resistant. Accordingly, the transition between third Schottky layer 140 and contact layer 150 defines third etch stop 142. Contact layer 150 may also be selected to be a material that is desirable for formation of metal contacts. By way of example, for third Schottky layer 140 of AlGaAs, contact layer 150 may be of GaAs doped with silicon. In the illustrated embodiment, contact layer 150 has lower contact layer 152 and upper contact layer 154 of the same material, but with different thicknesses and dopant concentrations. Lower contact layer 152 may have a thickness of about 100 angstroms and a dopant concentration of about $3 \times 10^{17}$ $cm^{-3}$. Upper contact layer 154 may have a thickness of about 350 angstroms and a dopant concentration of about $3 \times 10^{17}$ $cm^{-3}$.

Figure 3A:
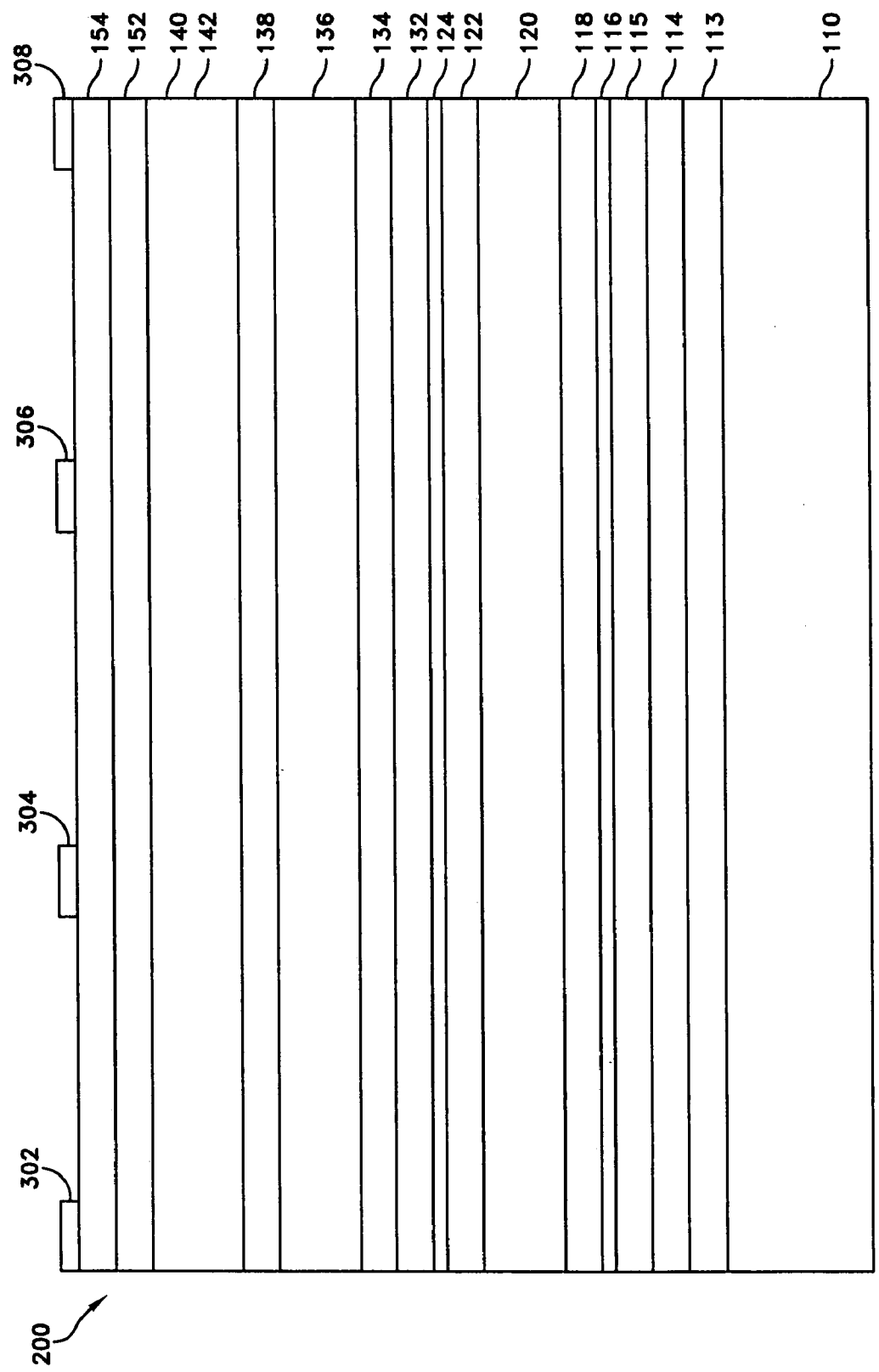
FIG. 3A is a partial sectional view showing the multi-layer structure of FIG. 2 with drain and source contacts.

Referring now to FIG. 3A to 3G, an exemplary process for fabrication of a depletion-mode pHEMT, an enhancement mode pHEMT, and a power pHEMT, on a structure of FIG. 2, will now be described. Referring to FIG. 3A, there is shown a structure 200 of FIG. 2, to which drain and source electrodes have been applied. Drain electrodes are shown at 302, 306, and source electrodes at 304, 308. Electrodes may be pads of a metal or other conductor formed by any suitable technique. In order to illustrate the method, the fabrication of three types of transistors side-by-side will be illustrated.

Figure 3B:
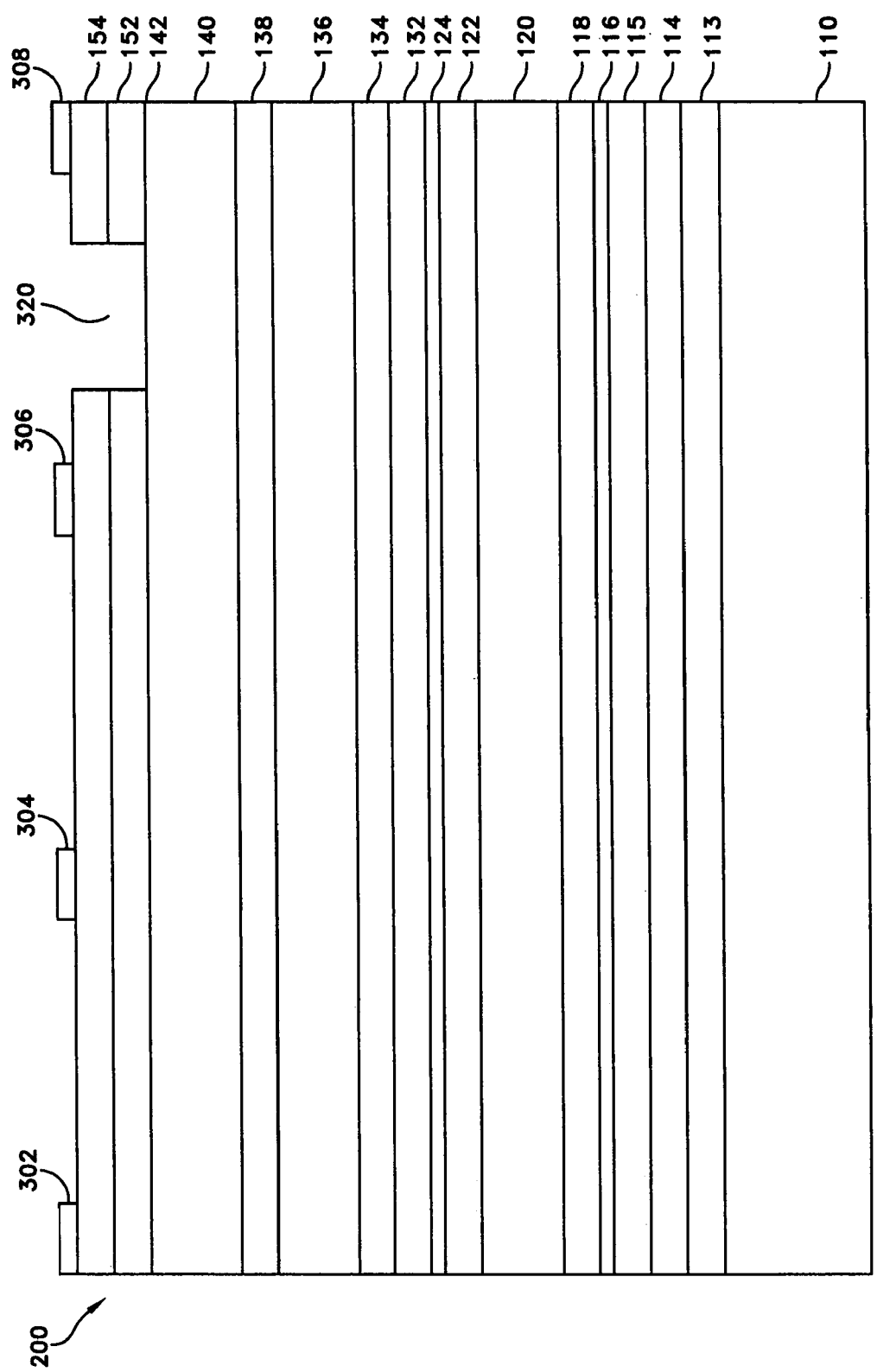
FIG. 3B is a partial section view showing the structure of FIG. 3A after a step of etching a wide portion of a gate recess for a power pHEMT.

In a first step, the wide recess for a power HEMT or pHEMT is formed. The pattern for the wide recess is provided on the upper surface of structure 200, to provide selective etching. An etch process and etchant are employed that effectively etches contact layer 150 but which does not effectively etch third Schottky layer 140. As uppermost Schottky layer 140 is of AlGaAs, an etch process technique is employed that will etch GaAs but not effectively etch AlGaAs. One of ordinary skill in the art may select an appropriate etch. Examples include a plasma etch with $Cl_2$ and $SF_2$ chemistry, and wet etches such as a citric acid etch. One of ordinary skill in the art may select additional etch parameters, including details of etch chemistry and the duration of exposure of the layers to etching. After this first etch step, the structure shown in FIG. 3B is obtained. A first recess portion 320 of a power HEMT gate recess having a first power HEMT gate recess portion width has been defined through contact layer 150 to and terminating at first etch stop 142. The first power HEMT gate recess portion width may be selected by those of skill in the art. First recess portion 320 defines a wide recess portion of a double recess for a gate electrode of a power HEMT or pHEMT.

Figure 3C:
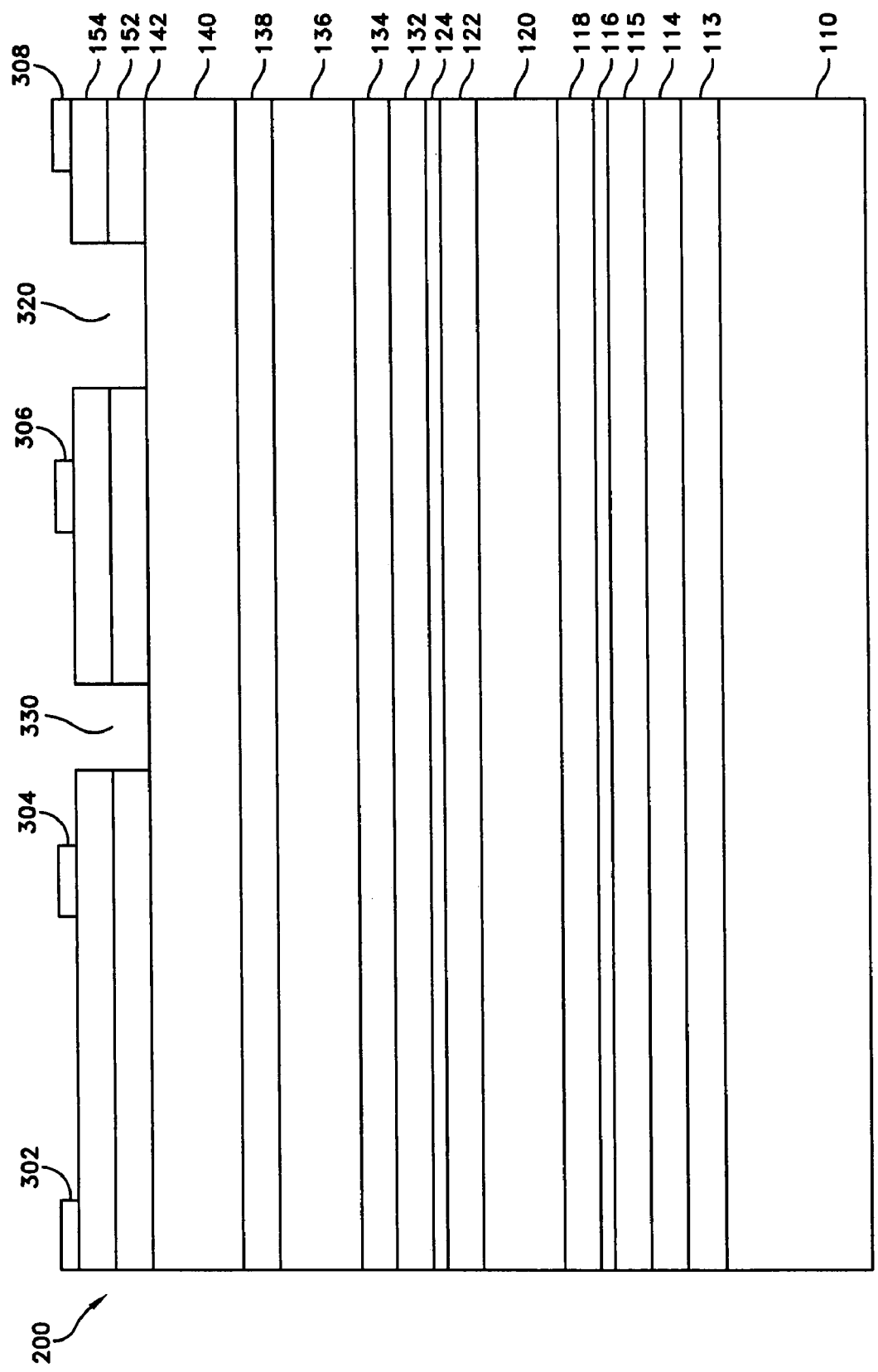
FIG. 3C is a partial sectional view showing the structure of FIG. 3B after a step of partially etching a gate recess for a depletion mode pHEMT.

In a next step, a gate recess for a depletion-mode type pHEMT is patterned on the upper surface of structure 200. A gate recess is then etched through contact layer 150 to underlying Schottky layer 140. This etch step may be carried out using one or more of the etch techniques described above in connection with etching of the wide gate recess for the power pHEMT. The resulting depletion mode HEMT or PHEMT partial gate recess 320 after this etching step is shown in FIG. 3C. Depletion mode HEMT gate recess 320 has a depletion mode gate width less than the first power HEMT gate recess portion width.

Figure 3D:
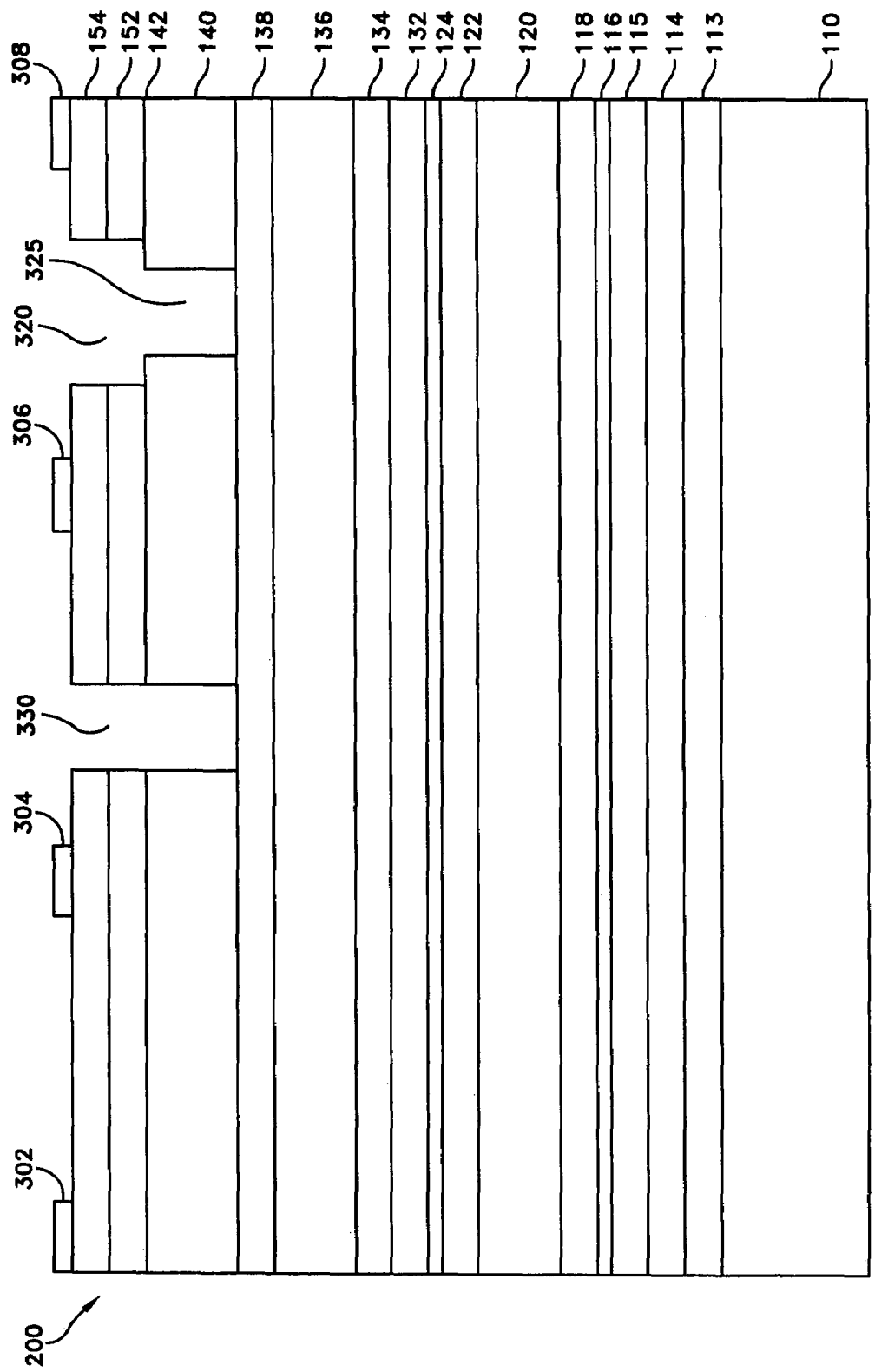
FIG. 3D is a partial section view showing the structure of FIG. 3C after a step of completing etching of gate recesses for a power pHEMT and for a depletion mode pHEMT.

In a next step, a narrow recess is formed to the intermediate etch stop in both the recess for the power pHEMT, and in the recess for the depletion mode PHEMT. An etching process is used that effectively etches through third Schottky layer 140, but does not effectively etch intermediate etch stop layer 138. In the illustrated embodiment, an etching process is used that etches AlGaAs, but is stopped by AlAs. An example of a suitable etch is succinic acid. A plasma etch process may be employed, such as a $Cl_2$ and $SF_2$ chemistry plasma; however, such a plasma etch process is comparatively slow, as AlGaAs is resistant to such a process. After this etching step, the structure shown in FIG. 3D is obtained. A second recess portion 325 of the power HEMT gate recess has been formed extending from first recess portion 320 through third Schottky layer 140 to intermediate etch-stop layer 138. Second recess portion 325 is preferably aligned with first recess portion 320. Depletion mode HEMT gate recess 330 is simultaneously extended through third Schottky layer 140 to intermediate etch-stop layer 138.

Figure 3E:
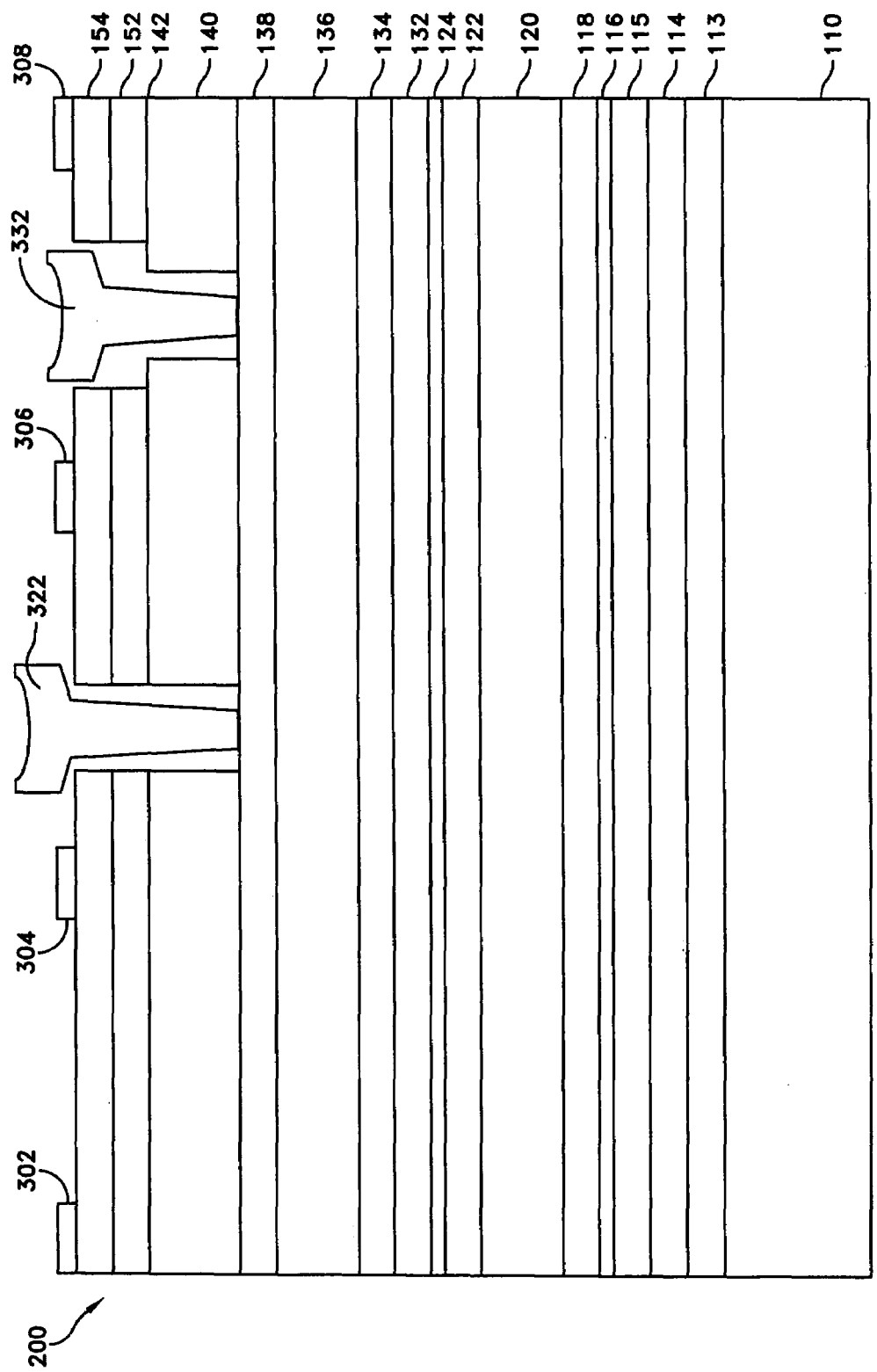
FIG. 3E is a partial sectional view showing the structure of FIG. 3D after a step of formation of gate electrodes for a power pHEMT and a depletion mode PHEMT.

In a following step, gate electrodes are formed for both types of depletion-mode HEMTs or pHEMTs, i.e., the depletion mode HEMTs or pHEMTs, having a single recess, and the power HEMTs or pHEMTs, having a double recess. Formation of gate electrodes may be accomplished by metallizing over a patterned resist, and then removing the resist and any metal overlying the resist to obtain the gates. Referring to FIG. 3E, gate electrode 322 is shown for a single recess depletion mode pHEMT, and gate electrode 332 is shown for the power pHEMT. In this embodiment, gate electrodes 322, 332, are T-gates, although other forms of gates may be employed. Second Schottky layer serves as the Schottky layer for both the depletion mode HEMT or PHEMT and the power HEMT or pHEMT.

Figure 3F:
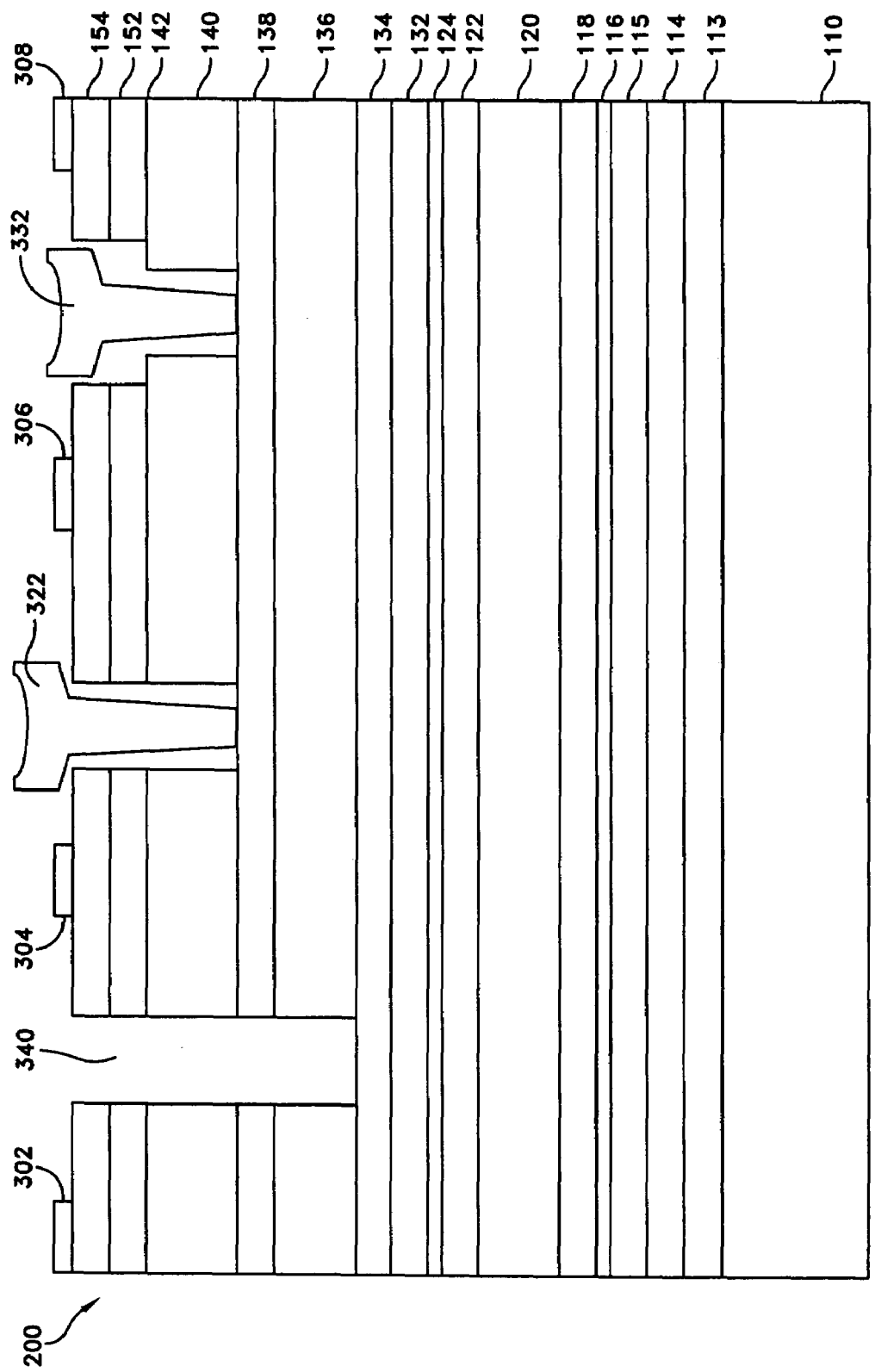
FIG. 3F is a partial sectional view showing the structure of FIG. 3E after a step of formation of a gate recess for an enhancement mode pHEMT.
Figure 3G:
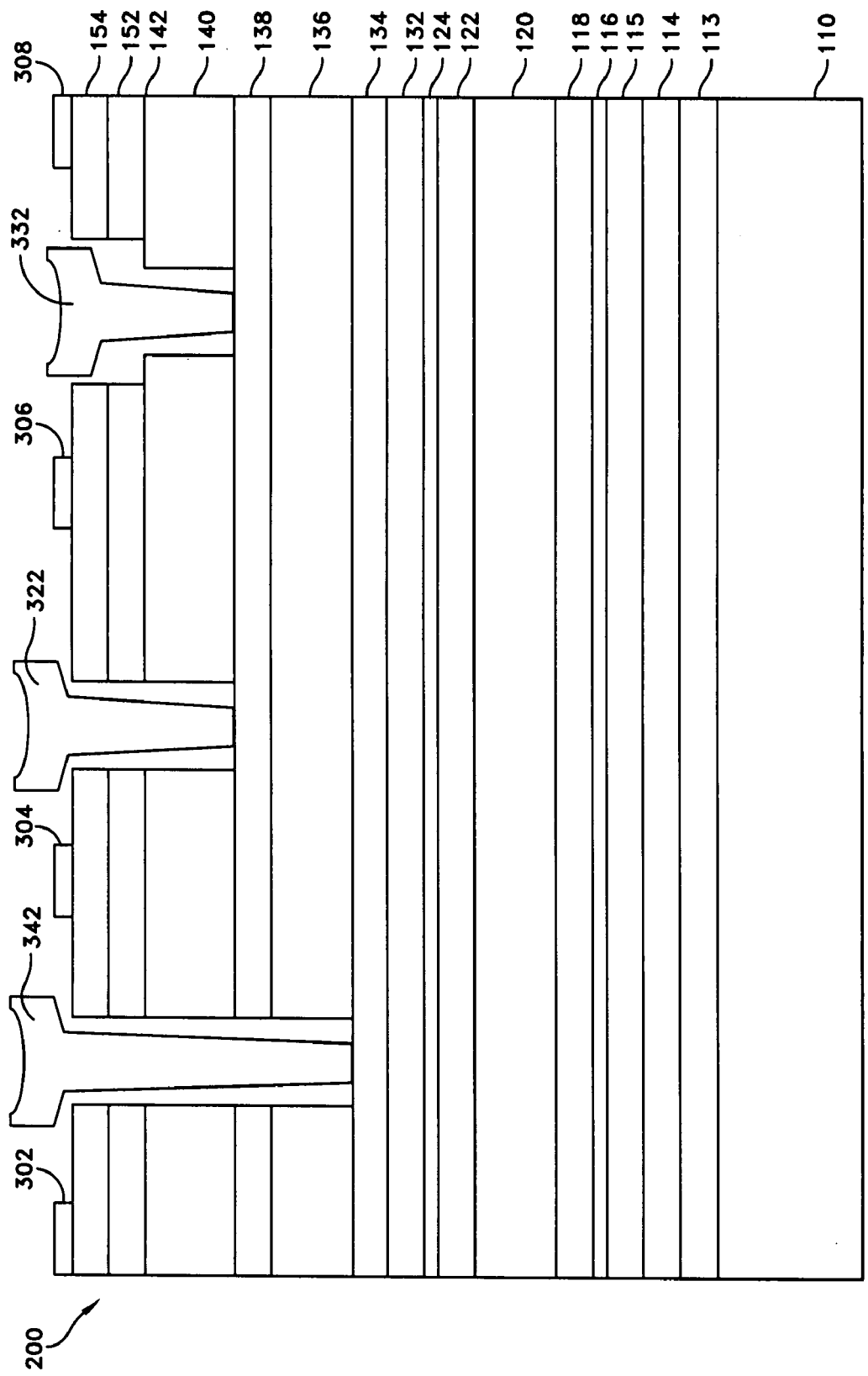
FIG. 3G is a partial sectional view showing the structure of FIG. 3F after a step of formation of a gate electrode for an enhancement mode PHEMT.

In a next step of the process, one or more recesses are formed for gate electrodes of enhancement mode HEMTs or pHEMTs on structure 200. A suitable resist is formed and patterned to expose the portions of contact layer 150 where the one or more recesses for gate electrodes of enhancement mode HEMTs or pHEMTs are to be formed. An enhancement mode HEMT gate recess is then defined by etching using a suitable etch process through the overlying layers to first etch stop layer 134. A wet etch such as a suitable mixture of sulfuric acid, hydrogen peroxide and water may be employed. The structure resulting from this etching step is shown in FIG. 3F. Recess 340 is a narrow recess, which extends through to lowest etch stop layer 134. In the following step, a gate electrode is formed in recess 340, such as by conventional metallizing, and removing of the resist and metal overlying the resist. Referring to FIG. 3G, gate electrode 342 has been formed for an enhancement mode HEMT or pHEMT. Gate electrode 342 is a T-gate, although other forms of gate may be employed. First Schottky layer 132 serves as a Schottky layer for an enhancement mode pHEMT.

An integrated circuit, such as a MMIC, may be fabricated by fabrication of operatively connected elements incorporating the depletion mode HEMT, enhancement mode HEMT, and power HEMT, illustrated in FIG. 3G. Depending on the size of structure 200 and the functionality to be incorporated, the integrated circuit may include from one to many of each type of HEMT, each of which has been formed on a single structure 200.

Numerous modifications may be made to the illustrated embodiment. For example, substitutions of materials may be made. For example, the structure 200 may be provided using phosphide based Type II-V semiconductors. For example the channel layer may be of InGaAs, with the spacer layers of InP, and the Schottky layers of InAlP or InGaP, on an InP substrate.

In another example, the structure 200 may be provided using nitride based III-V semiconductors. For example, the channel layer may be of AlGaN, with the spacer layers and Schottky layers of GaN, on substrate of GaN. Alternatively, the channel layer may be of InGaN, with spacer layers of AlGaN, and Schottky layers of GaN, on a GaN substrate. Those of ordinary skill in the art will appreciate that antimony based Type III-V semiconductors, such as GaSb, AlSb, and InSb may be employed. Other Type III-V semiconductors, Type IV semiconductors (silicon, germanium, and SiGe) and Type II-VI semiconductors (such as ZnS, CdSe, ZnSe, CdS and CdO), may be employed.

The invention may be employed for the fabrication of conventional HEMTs, pHEMTs, and mHEMTs.

An advantage of the described structure include the ability to manufacture integrated circuit components on a single substrate having at least one enhancement mode transistor, at least one depletion mode transistor, and at least one power transistor, thereby providing smaller devices and simpler fabrication processes. A further advantage is the ability simultaneously to etch at least portions of the gate recesses of power HEMTs and depletion mode HEMTs, and gate metallizing for depletion mode HEMTs and power mode HEMTs simultaneously, thereby reducing the number of process fabrication steps.

Figure 4:
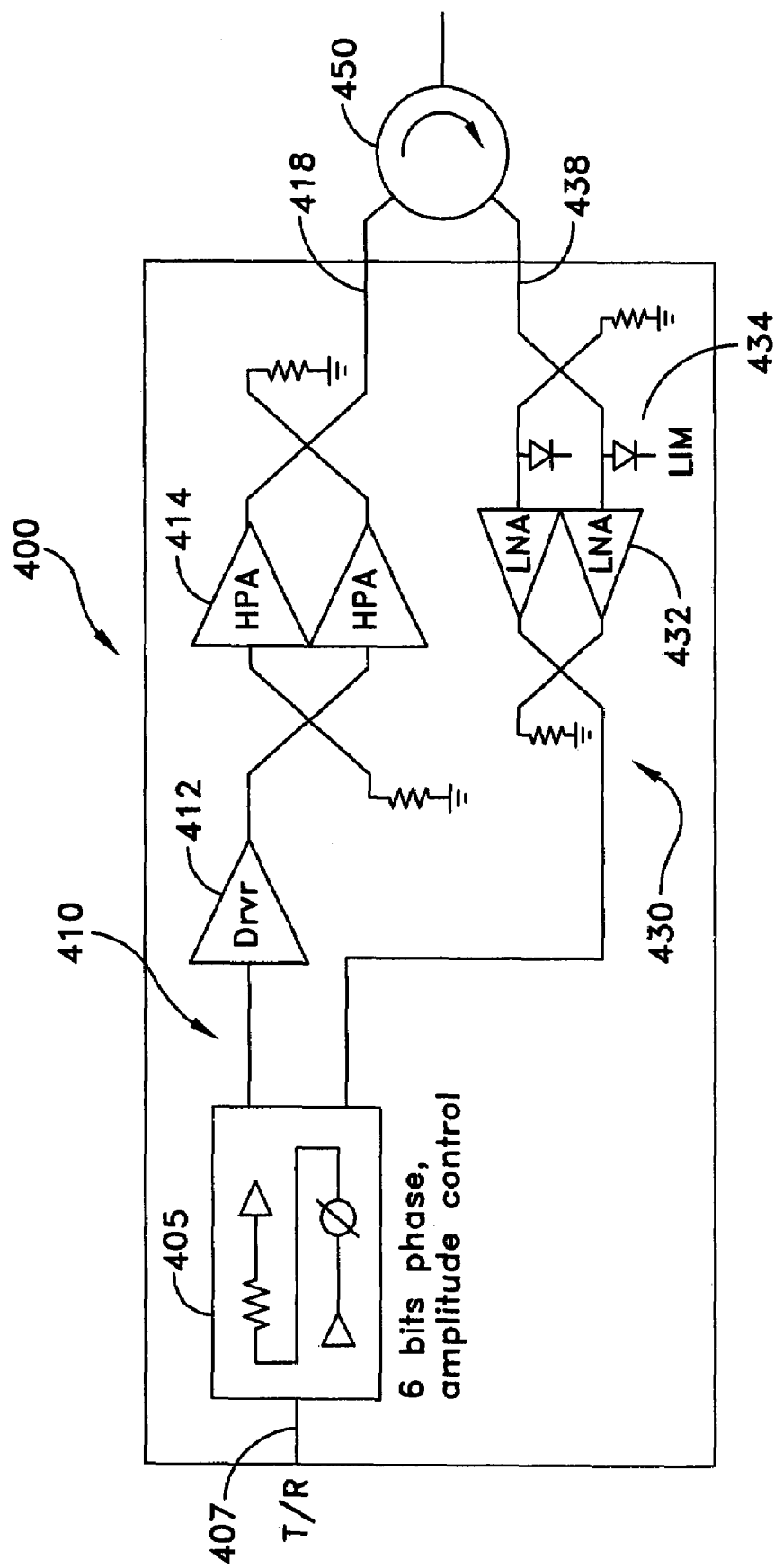
FIG. 4 is a circuit diagram of a transmit/receive module of the prior art.

One exemplary application of a method and apparatus in accordance with an embodiment of the invention is in a transmit/receive module, such as a transmit/receive module for a radar array. A circuit diagram for a transmit/receive module 400 of the prior art is shown in FIG. 4. Transmit/receive module 400 is adapted to be coupled at communications channel 407 to a circuit for providing and transmitting RF or microwave signals. Transmit/receive module 400 has phase and amplitude control 405, for controlling and adjusting the phase of signals that are passed through communications channel 407. Phase/amplitude control 405 is coupled through, in a transmit channel 410, to driver 412, which is in turn coupled to high power amplifiers 414. High power amplifiers 414 are coupled to a transmit output 418 of transmit/receive module 400. Phase/amplitude control 405 is coupled in a receive channel 430 to low noise amplifiers 432. Low noise amplifiers 432 are in turn coupled through limiters 434 to a receive input 438 of transmit/receive module 400. Transmit output 418 and receive output 438 are adapted to be coupled to circulator 450, which may in turn be coupled to an array element (not shown). In the prior art, the illustrated circuit elements have been implemented as discrete devices. In an application of the invention, two or more of the illustrated components of transmit/receive module 400 may be fabricated on a single structure of the invention. It will be understood that the transmit/receive module 400 is exemplary, and that the application of the invention to transmit/receive modules for radar arrays is not limited to a transmit/receive module as shown in FIG. 4.

The invention may be implemented in transceivers in other types of systems and devices. By way of example, two or more components of a transceiver for cellular telephones may be implemented on a single structure of the invention.

While the foregoing invention has been described with reference to the above, various modifications and changes can be made without departing from the spirit of the invention. Accordingly, all such modifications and changes are considered to be within the scope of the appended claims.

What is claimed is:

1. A multi-layer structure for use in the fabrication of integrated circuit devices, comprising:
   a buffer layer on a substrate;
   a channel layer on said buffer layer;
   a spacer layer on said channel layer;
   a first Schottky layer on said spacer layer;
   a second Schottky layer overlying said first Schottky layer;
   a third Schottky layer overlying said second Schottky layer;
   a contact layer overlying said third Schottky layer;
   said structure having defined therein:
   a first etch-stop intermediate said first Schottky layer and said second Schottky layer;
   a second etch-stop intermediate said second Schottky layer and said third Schottky layer; and
   a third etch-stop intermediate said contact layer and said third Schottky layer.

2. The structure of claim 1, wherein said first etch-stop is defined by a layer of a substance resistant to an etch process effective in etching each of said overlying layers.

3. The structure of claim 2, wherein said first etch stop comprises a layer of GaInP.

4. The structure of claim 1, wherein said second etch stop comprises a layer of AlAs.

5. The structure of claim 2, wherein said third etch stop is defined by said third Schottky layer being made of a material resistant to an etch process effective in etching said contact layer.

6. The structure of claim 5, wherein said third Schottky layer is of AlGaAs and said contact layer is of GaAs.

7. The structure of claim 1, wherein said first, second and third Schottky layers are of doped AlGaAs.

8. A method of fabricating a multi-layer structure for use in the fabrication of integrated circuit devices, comprising the steps of:
   forming a buffer layer on a substrate;
   forming a channel layer on said buffer layer;
   forming a spacer layer on said channel layer; forming a first Schottky layer on said spacer layer;
   forming a second Schottky layer on said first Schottky layer;
   forming a third Schottky layer on said second Schottky layer; and
   forming a contact layer on said third Schottky layer;
   said method comprising defining: a first etch stop intermediate said first Schottky layer and said second Schottky layer; a second etch stop intermediate said second Schottky layer and said third Schottky layer, and a third etch-stop intermediate said third Schottky layer and said contact layer.

9. The method of claim 8, wherein said first etch stop is defined by a first etch stop layer of a substance resistant to an etch process effective in etching each of said overlying layers.

10. The method of claim 9, wherein said first etch stop layer comprises a layer of GaInP.

11. The method of claim 8, wherein said second etch stop is defined by a second etch stop layer comprising a layer of AlAs.

12. The method of claim 8, wherein said third etch stop is defined by said third Schottky layer being made of a material resistant to an etch process effective in etching said contact layer.

13. The method of claim 12, wherein said third Schottky layer is of AlGaAs and said contact layer is of GaAs.

14. The method of claim 8, wherein said first, second and third Schottky layers are of doped AlGaAs.

* * * * *